(12) United States Patent
Bai et al.

(10) Patent No.: US 12,136,507 B2
(45) Date of Patent: Nov. 5, 2024

(54) HYBRID RESISTORS INCLUDING RESISTOR BODIES WITH DIFFERENT DRIFT EFFECTS

(71) Applicant: GlobalFoundries Singapore Pte. Ltd., Singapore (SG)

(72) Inventors: Qiang Bai, Singapore (SG); Kumar Singh Sudhish, Singapore (SG); Biying Guan, Singapore (SG); Venkataramani Chandrasekar, Singapore (SG); Karan Khullar, Dresden (DE); Lingfen Kong, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 267 days.

(21) Appl. No.: 17/708,094

(22) Filed: Mar. 30, 2022

(65) Prior Publication Data
US 2023/0317324 A1    Oct. 5, 2023

(51) Int. Cl.
*H01C 17/00*    (2006.01)
*H01L 23/522*    (2006.01)
*H01L 49/02*    (2006.01)

(52) U.S. Cl.
CPC ....... *H01C 17/006* (2013.01); *H01L 23/5228* (2013.01); *H01L 28/24* (2013.01)

(58) Field of Classification Search
CPC .... H01C 17/006; H01L 23/5228; H01L 28/24
See application file for complete search history.

(56) References Cited

U.S. PATENT DOCUMENTS

| | | | | |
|---|---|---|---|---|
| 8,227,897 | B2 * | 7/2012 | Kim | ........................ H10B 43/40 257/536 |
| 8,558,654 | B2 * | 10/2013 | Le Neel | ............. H01C 17/0656 338/22 SD |
| 8,786,396 | B2 * | 7/2014 | Leung | .................. H01C 17/265 338/22 SD |
| 8,896,408 | B2 * | 11/2014 | Gobbi | ................ H01L 23/5228 29/610.1 |
| 11,514,300 | B2 * | 11/2022 | Chen | ...................... G06N 3/063 |
| 2008/0237800 | A1 * | 10/2008 | Chinthakindi | .... H01L 21/76895 257/E29.001 |

(Continued)

OTHER PUBLICATIONS

Newton Schwartz, W.A. et al., "Temperature coefficient of resistance of beta-tantalum films and mixtures with b.c.c.-tantalum," Thin Solid Films, vol. 14, Issue 2, pp. 333-346, ISSN 0040-6090, https://doi.org/10.1016/0040-6090(72)90433-6. https://www.sciencedirect.com/science/article/pii/0040609072904336 (1972).

(Continued)

*Primary Examiner* — Kyung S Lee
(74) *Attorney, Agent, or Firm* — Thompson Hine LLP; Anthony Canale

(57) ABSTRACT

Structures for an on-chip resistor and methods of forming a structure for an on-chip resistor. The structure includes a first resistor body and a second resistor body coupled to the first resistor body. The first resistor body contains a first material having a first drift effect. The second resistor body contains a second material having a second drift effect that is different from the first drift effect.

20 Claims, 3 Drawing Sheets

(56) References Cited

U.S. PATENT DOCUMENTS

2013/0130468 A1* 5/2013 Higashitani ............ H01L 28/88
 257/E21.004
2020/0394501 A1* 12/2020 Chen ...................... G06N 3/065

OTHER PUBLICATIONS

Nguyen, Duy-Cuong et al., "Effect of annealing temperature on structural and electrical properties of tantalum nitride thin film resistors deposited on SiO2/Si substrates by dc sputtering technique," Journal of Vacuum Science & Technology B: Microelectronics and Nanometer Structures. 24. 682-685. 10.1116/1.2178375 (2006).

Lu, Qinxin & Zhang, Xiuqing & Gu, Liangnan; "Effect of Sputtering Power on the Properties of TaN Thin Films Prepared by the Magnetron Sputtering. DEStech Transactions on Materials Science and Engineering," 10.12783/dtmse/smne2016/10559 (2017).

\* cited by examiner

HYBRID RESISTORS INCLUDING RESISTOR BODIES WITH DIFFERENT DRIFT EFFECTS

BACKGROUND

The disclosure relates generally to semiconductor devices and integrated circuit fabrication and, more specifically, to structures for an on-chip resistor and methods of forming a structure for an on-chip resistor.

On-chip resistors are passive devices found in many integrated circuits. An on-chip resistor may be formed by depositing a layer of resistor material having a given thickness and patterning the resistor material layer to provide a resistor body that is dimensioned to a particular shape. The resistance of an on-chip resistor is based on a combination of physical properties, such as cross-sectional area and length, and material properties, such as resistivity.

The resistance of the on-chip resistor may drift under electric current stress. The resistance variation is governed by the drift effect and the temperature coefficient of resistance of the resistor material. Certain applications may require the drift effect be optimized. Other applications may require that the temperature coefficient of resistance be optimized.

Improved structures for an on-chip resistor and methods of forming a structure for an on-chip resistor are needed.

SUMMARY

In an embodiment, a structure for a resistor is provided. The structure comprises a first resistor body and a second resistor body coupled to the first resistor body. The first resistor body comprises a first material having a first drift effect. The second resistor body comprises a second material having a second drift effect that is different from the first material.

In an embodiment, a method of forming a structure for a resistor is provided. The method includes forming a first resistor body comprising a first material having a first drift effect, and forming a second resistor body coupled to the first resistor body. The second resistor body comprises a second material having a second drift effect that is different from the first drift effect.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
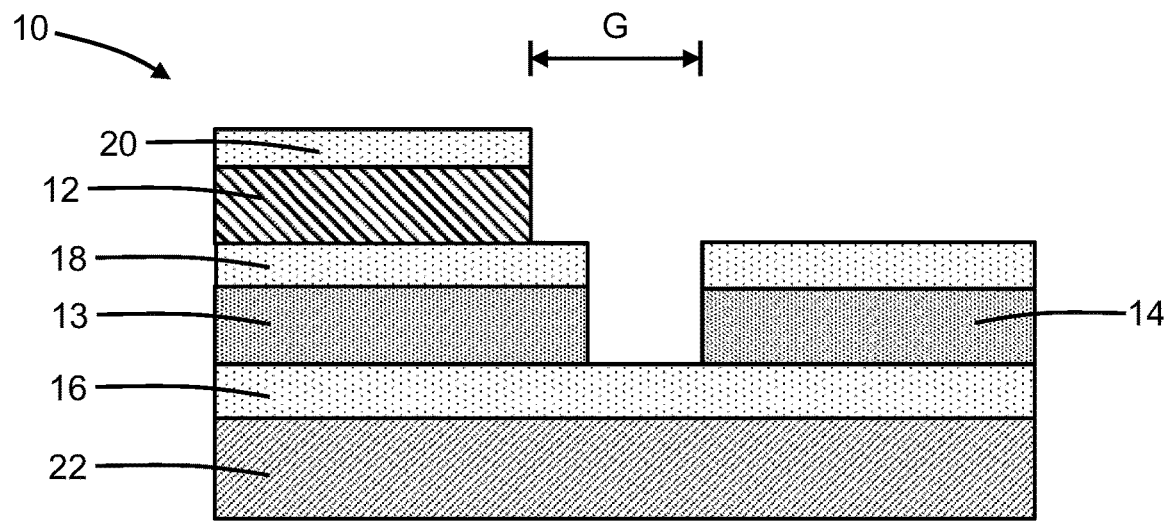
FIG. 1 is cross-sectional view of a structure at an initial fabrication stage of a processing method in accordance with embodiments of the invention.

With reference to FIG. 1 and in accordance with embodiments of the invention, a structure 10 for a hybrid resistor includes a resistor body 12 and a resistor body 14. The resistor body 14 may be formed on a top surface of a dielectric layer 16, the resistor body 12 may be formed on a top surface of a dielectric layer 18, and the dielectric layer 16 may be positioned on a top surface of a conductive feature 22. The dielectric layer 18 is also positioned on a top surface of the resistor body 14, and a dielectric layer 20 is positioned on a top surface of the resistor body 12. The dielectric layers 16, 18, 20 may be comprised of a dielectric material, such as silicon nitride, that is an electrical insulator. The conductive feature 22 may be comprised of a metal, such as copper. The resistor body 12 is characterized by a value of electrical resistance, and the resistor body 14 is also characterized by a value of electrical resistance. In an embodiment, the resistor body 12 and the resistor body 14 may have equal electrical resistances.

The resistor body 12, the resistor body 14, the dielectric layers 16, 18, 20, and the conductive feature 22 may be formed in an interconnect structure that is positioned over a substrate, such as a bulk substrate or a semiconductor-on-insulator substrate, and the substrate may include device structures formed by front-end-of-line processing. The resistor body 14 is positioned in a lateral direction adjacent to the resistor body 12. The resistor body 14 is positioned in a vertical direction at a different elevation within the interconnect structure than the resistor body 12. The resistor body 12 has a non-overlapping relationship with the resistor body 14. In that regard, the nearest-neighbor edges of the resistor bodies 12, 14 are laterally spaced apart by a gap G.

The resistor body 12 is comprised of a material having a resistivity, a drift effect, and a temperature coefficient of resistance. The resistor body 14 is also comprised of a material having a resistivity, a drift effect, and a temperature coefficient of resistance. The drift effect is a change or shift in the electrical resistance in response to an electric current stress that saturates at certain resistance value under a constant electric current stress and then recovers after the electric current stress is removed. A positive drift effect indicates that the electrical resistance increases under electric current stress, and a negative drift effect indicates that the electrical resistance decreases under electric current stress. The electrical resistance of the resistor body 12 and the resistor body 14 each change due to the resistance drift. In an embodiment, the drift effect of the resistor body 12 is different from the drift effect of the resistor body 14 inasmuch as the resistance of one of the resistor bodies 12, 14 increases under electric current stress and the resistance of the other of the resistor bodies 12, 14 decreases under electric current stress. In an embodiment, the drift effect of the resistor body 12 may be positive, and the drift effect of the resistor body 14 may be negative. In an embodiment, the drift effect of the resistor body 12 may be negative, and the drift effect of the resistor body 14 may be positive.

In an embodiment, the resistor body 12 and the resistor body 14 may be comprised of the same material. In an embodiment, the resistor body 12 and the resistor body 14 may be comprised of tantalum nitride that is deposited by physical vapor deposition with, for example, a plasma sputtering process. In each instance, the deposited material is patterned to shape to form one of the resistor bodies 12, 14 by lithography and etching processes. A section 13 of the material of the resistor body 14 may be positioned as a layer beneath the resistor body 12 and separated from the resistor body 12 by a section of the dielectric layer 18.

The difference between the drift effect of resistor body 12 and the drift effect of the resistor body 14 may be produced by depositing their constituent materials under different deposition conditions. In that regards, the drift effect may be determined, at least in part, by the plasma power during the plasma sputtering process depositing the different resistor bodies 12, 14. The difference in deposition conditions may produce a difference in material properties, such as a difference in crystallinity. In an embodiment, the resistor body 12 may be formed by a plasma sputtering process in which a substantially constant plasma power in a range of 7500 Watts to 8500 Watts is applied over the duration of the deposition process. In an embodiment, the resistor body 14 may be formed by a plasma sputtering process in which multiple plasma powers are utilized. For example, in a dual-stage process, an initial plasma power may be applied over an initial portion of the deposition process, and a different plasma power may be applied over a subsequent portion of the deposition process. In an embodiment, the initial portion of the deposition process may employ a plasma power in range of 250 Watts to 350 Watts applied for a duration of 20 to 30 seconds, and the subsequent portion of the deposition process may employ a plasma power in range of 7500 Watts to 8500 Watts applied for a duration of 15 to 25 seconds. The lower plasma power during the initial stage of the deposition process, compared to the subsequently-applied plasma power that is over an order of magnitude higher, may provide the difference in drift effect and may also provide a difference in resistivity.

Figure 2:
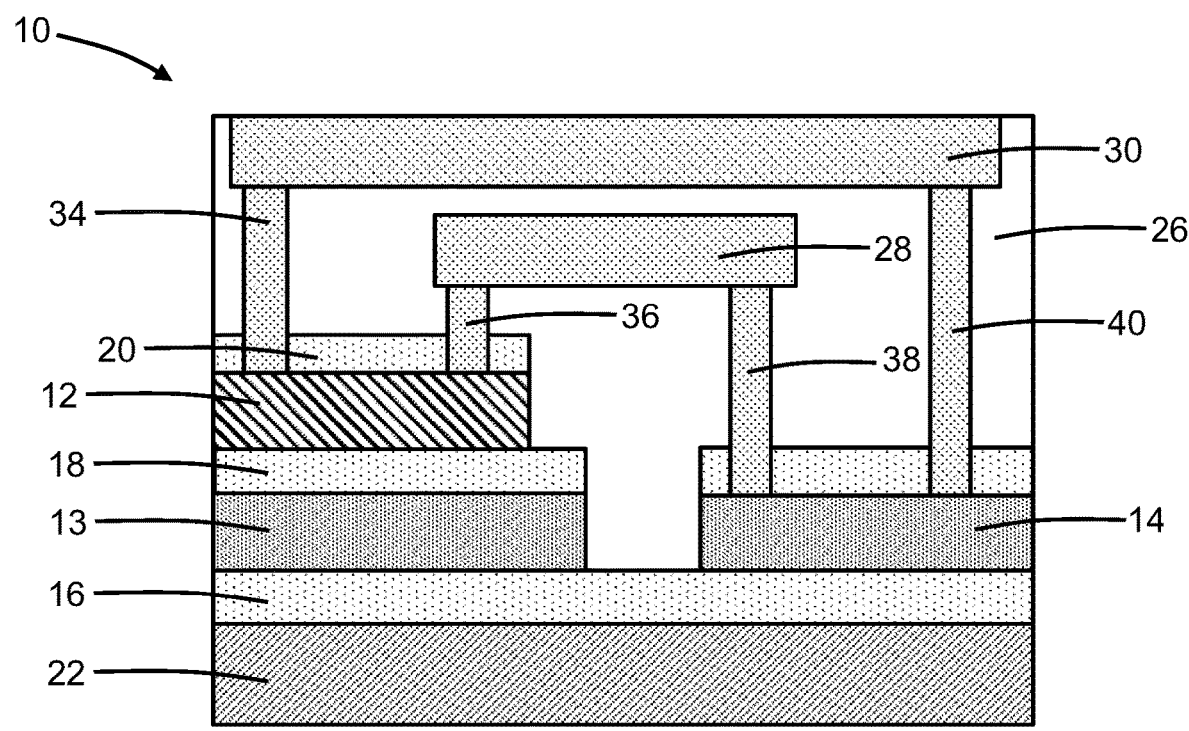
FIG. 2 is a cross-sectional view of the structure at a fabrication stage subsequent to FIG. 1.

With reference to FIG. 2 in which like reference numerals refer to like features in FIG. 1 and at a subsequent fabrication stage, a dielectric layer 26 may be formed over the resistor bodies 12, 14. The dielectric layer 26 may be comprised of a dielectric material, such as silicon dioxide, that is an electrical insulator. Wires 28, 30 and vias 34, 36, 38, 40 may be formed as conductive features in the dielectric layer 26. The wires 28, 30 and vias 34, 36, 38, 40 may be comprised of a metal, such as copper, and may be formed in the dielectric layer 26 by a dual damascene process.

The wires 28, 30 and vias 34, 36, 38, 40 may be used to connect the resistor body 12 to the resistor body 14 in a circuit to provide the hybrid resistor constituting the structure 10. In an embodiment, the wires 28, 30 and vias 34, 36, 38, 40 may be used to electrically couple the resistor body 12 in parallel with the resistor body 14. To that end, the wire 28 may be connected by the via 36 to a portion of the resistor body 12 and by the via 38 to a portion of the resistor body 14. The wire 30 may be connected by the via 34 to a different portion of the resistor body 12 and by the via 40 to a different portion of the resistor body 14. The vias 34, 36 penetrate through the dielectric layer 20 to the resistor body 12, and the vias 38, 40 penetrate through the dielectric layer 18 to the resistor body 12. The section 13 containing the same material as the resistor body 14 may not be connected in the circuit.

In use, the resistor body 12 and the resistor body 14 may exhibit different resistance drifts in response to an electric current passed through the circuit. In an embodiment, the resistance of the resistor body 12 may increase under electric current stress and saturate for a constant electric current stress, and the resistance of the resistor body 14 may decrease under electric current stress and saturate for a constant electric current stress. In an embodiment, the resistance of the resistor body 12 may decrease under electric current stress and saturate for a constant electric current stress, and the resistance of the resistor body 14 may increase under electric current stress and saturate for a constant electric current stress. The opposite drift effects of the resistor bodies 12, 14 are self-compensating such that the hybrid resistor including the resistor bodies 12, 14 exhibits a near-zero resistance drift under constant electric current stress.

The resistor bodies 12, 14 are individually engineered to have a different drift effects and, preferably, one of the resistor bodies 12, 14 has a positive drift effect and the other of the resistor bodies 12, 14 has a negative drift effect. A result is that the resistance of the hybrid resistor including the resistor bodies 12, 14 does not change significantly over a range of operating currents providing the electric current stress.

Figure 3:
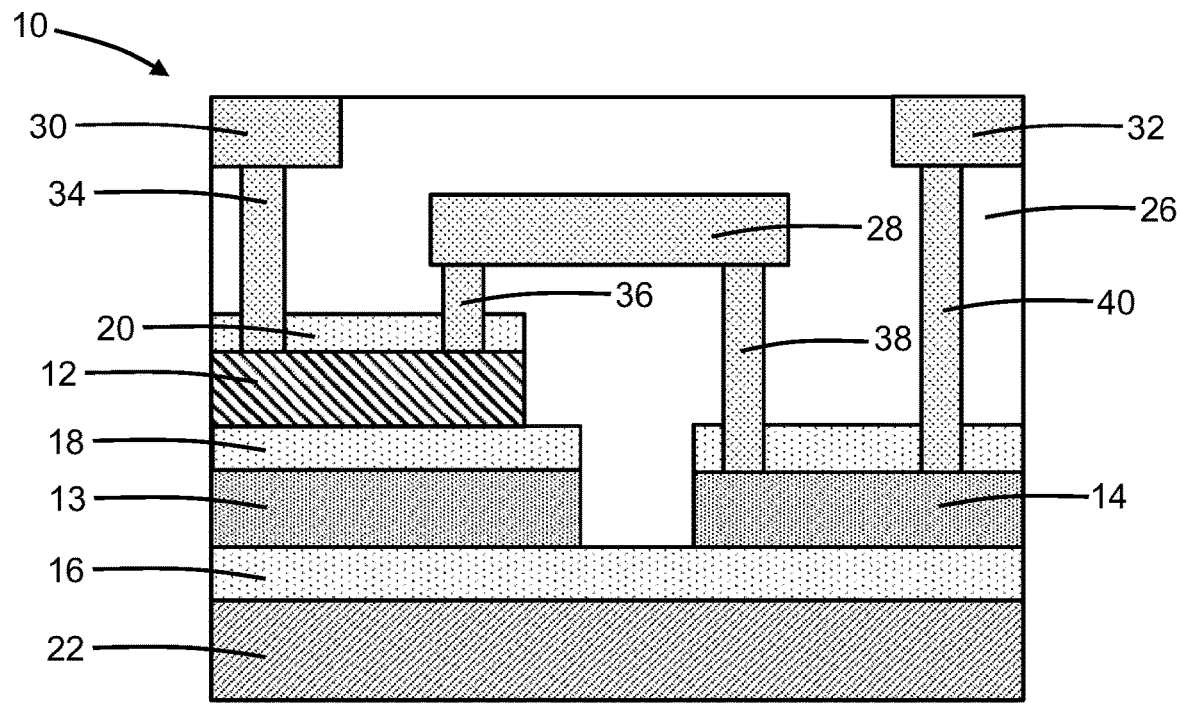
FIG. 3 is a cross-sectional view of a structure in accordance with alternative embodiments of the invention.

With reference to FIG. 3 in which like reference numerals refer to like features in FIG. 2 and in accordance with alternative embodiments, the resistor body 12 may be electrically coupled in series with the resistor body 14. To that end, the wire 28 may be connected by the via 36 to a portion of the resistor body 12 and by the via 38 to a portion of the resistor body 14. The wire 30 may be connected by the via 34 to a different portion of the resistor body 12, and the via 40 may connect a wire 32 to a different portion of the resistor body 14.

Figure 4:
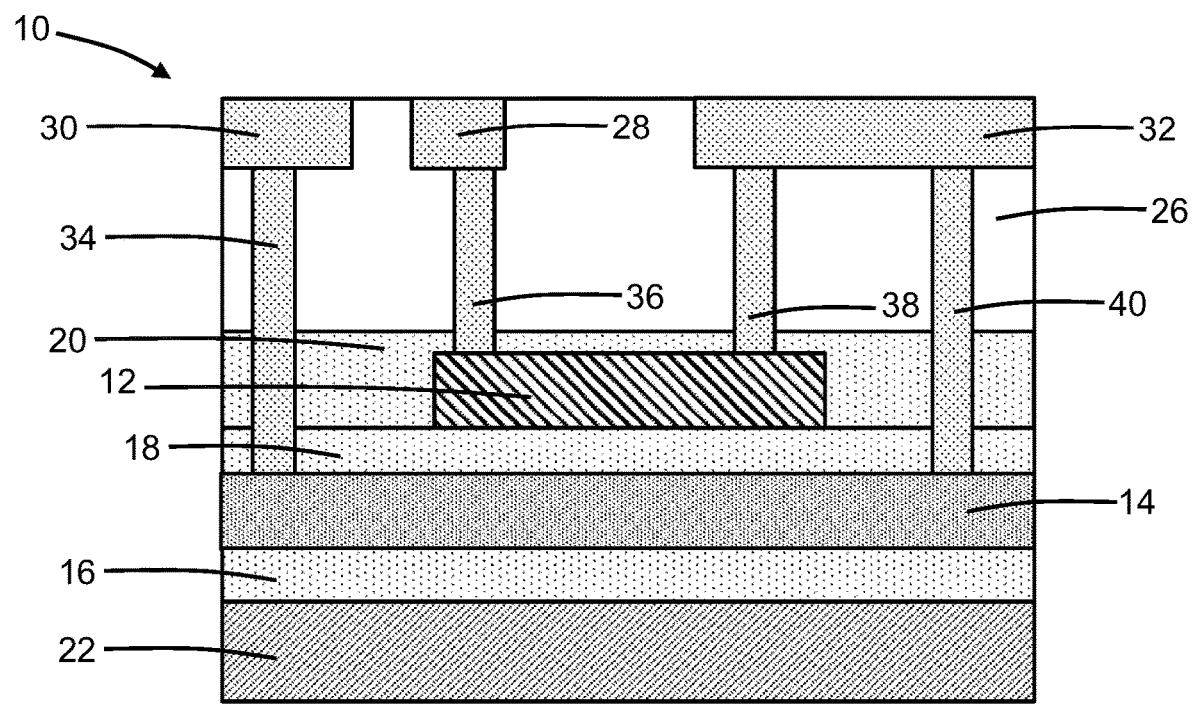
FIG. 4 is a cross-sectional view of a structure in accordance with alternative embodiments of the invention.

With reference to FIG. 4 and in accordance with alternative embodiments, the resistor body 12 may be positioned in a vertical direction over the resistor body 14 and electrically coupled in series with the resistor body 14. The resistor body 12 may be positioned adjacent to the resistor body 14, and the resistor body 12 may be positioned in an overlapping arrangement with the resistor body 14. In an embodiment, the resistor body 12 may be substantially centered over the resistor body 14, which promotes the connections of the resistor body 14 to the wires 28, 30. The dielectric layer 18 is positioned in a vertical direction between the resistor body 14 and the resistor body 12. In the representative embodiment, the resistor body 12 is positioned over the resistor body 14 in the overlapping arrangement. In an alternative embodiment, the resistor body 14 may be positioned over the resistor body 12 in the overlapping arrangement.

Figure 5:
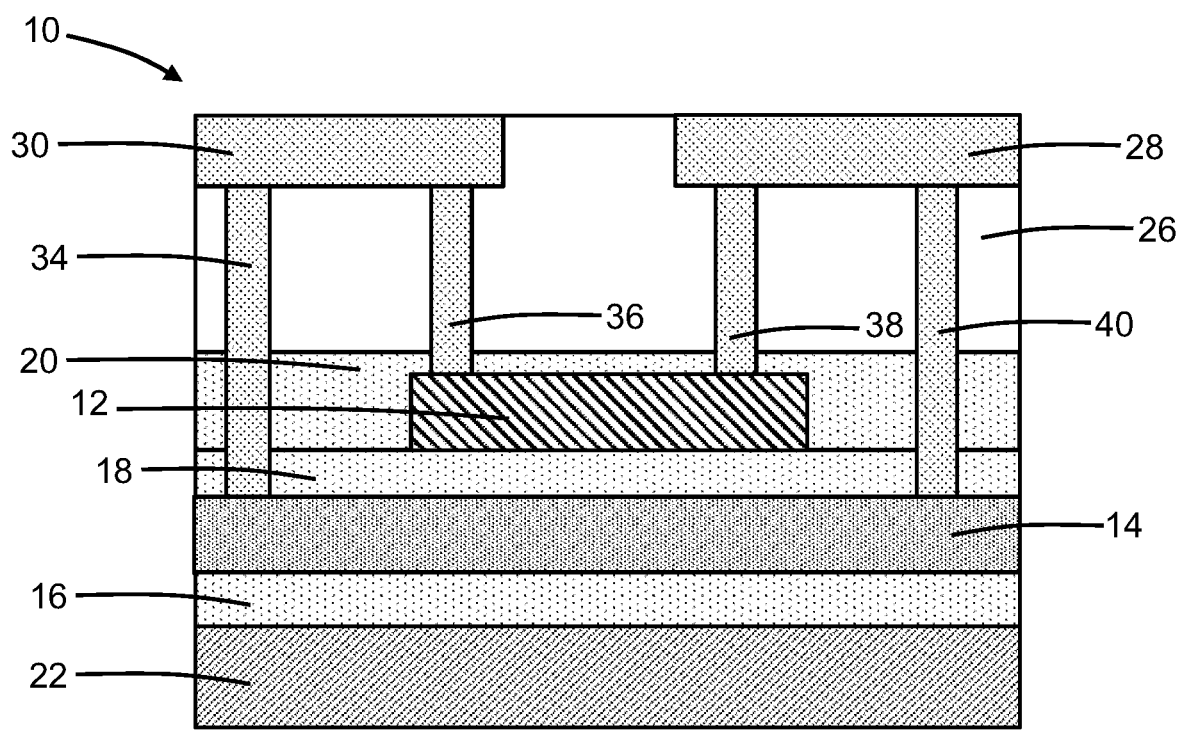
FIG. 5 is a cross-sectional view of a structure in accordance with alternative embodiments of the invention.

With reference to FIG. 5 in which like reference numerals refer to like features in FIG. 4 and in accordance with alternative embodiments, the resistor body 12 may be positioned adjacent to and in a vertical direction over the resistor body 14 with the overlapping relationship, and the resistor body 12 may be electrically coupled in parallel with the resistor body 14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a resistor, the structure comprising:
   a first resistor body comprising a first material having a first drift effect; and
   a second resistor body coupled to the first resistor body, the second resistor body comprising a second material having a second drift effect that is different from the first drift effect,
   wherein the first material is tantalum nitride and the first drift effect is positive, and the second material is tantalum nitride and the second drift effect is negative.

2. The structure of claim 1 wherein the second resistor body is positioned adjacent to the first resistor body.

3. The structure of claim 2 wherein the first resistor body has a non-overlapping arrangement with the second resistor body.

4. The structure of claim 3 wherein the second resistor body is electrically coupled in series to the first resistor body.

5. The structure of claim 3 wherein the second resistor body is electrically coupled in parallel to the first resistor body.

6. The structure of claim 3 wherein the second resistor body is laterally spaced by a gap from the first resistor body.

7. The structure of claim 2 wherein the first resistor body has an overlapping arrangement with the second resistor body.

8. The structure of claim 7 further comprising:
   a dielectric layer positioned in a vertical direction between the first resistor body and the second resistor body.

9. The structure of claim 7 wherein the second resistor body is electrically coupled in series to the first resistor body.

10. The structure of claim 7 wherein the second resistor body is electrically coupled in parallel to the first resistor body.

11. The structure of claim 7 wherein the first resistor body is substantially centered over the second resistor body.

12. The structure of claim 1 wherein the second resistor body is electrically coupled in series to the first resistor body.

13. The structure of claim 1 wherein the second resistor body is electrically coupled in parallel to the first resistor body.

14. The structure of claim 1 further comprising:
   a dielectric layer positioned in a vertical direction between the first resistor body and the second resistor body.

15. The structure of claim 14 further comprising:
   a section of the second material is disposed beneath the first resistor body, the section separated from the first resistor body by the dielectric layer.

16. A method of forming a structure for a resistor, the method comprising:
   forming a first resistor body comprising a first material having a first drift effect; and
   forming a second resistor body coupled to the first resistor body, wherein the second resistor body comprises a second material having a second drift effect that is different from the first drift effect,
   wherein the first drift effect is positive, the second drift effect is negative, the first material comprises tantalum nitride, and the second material comprises tantalum nitride formed with different deposition conditions than the first material.

17. The method of claim 16 wherein the second material is formed using a first plasma power followed by a second plasma power that is greater than the first plasma power.

18. The method of claim 16 wherein the second resistor body is positioned adjacent to the first resistor body, and the first resistor body is positioned in a non-overlapping arrangement with the second resistor body.

19. The method of claim 16 further comprising:
   forming an interconnect structure that includes a plurality of conductive features that electrically couple the second resistor body in series to the first resistor body.

20. The method of claim 16 further comprising:
   forming an interconnect structure that includes a plurality of conductive features that electrically couple the second resistor body in parallel to the first resistor body.

* * * * *